US011877480B2

(12) United States Patent
Jeon et al.

(10) Patent No.: US 11,877,480 B2
(45) Date of Patent: Jan. 16, 2024

(54) DISPLAY DEVICE AND METHOD OF MANUFACTURING THE SAME

(71) Applicant: Samsung Display Co., Ltd., Yongin-si (KR)

(72) Inventors: Bogeon Jeon, Yongin-si (KR); Jungi Kim, Yongin-si (KR); Yangho Jung, Yongin-si (KR); Seonhwa Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 4 days.

(21) Appl. No.: 17/686,885

(22) Filed: Mar. 4, 2022

(65) Prior Publication Data

US 2022/0190077 A1 Jun. 16, 2022

Related U.S. Application Data

(62) Division of application No. 16/598,604, filed on Oct. 10, 2019, now Pat. No. 11,302,758.

(30) Foreign Application Priority Data

Nov. 26, 2018 (KR) .......................... 10-2018-0147689

(51) Int. Cl.
*H10K 59/124* (2023.01)
*H10K 50/844* (2023.01)
(Continued)

(52) U.S. Cl.
CPC ......... *H10K 59/124* (2023.02); *H10K 50/844* (2023.02); *H10K 71/00* (2023.02); *H10K 59/1201* (2023.02)

(58) Field of Classification Search
CPC .... H10K 59/122; H10K 59/126; H10K 50/80; H10K 59/00; H10K 2102/302;
(Continued)

(56) References Cited

U.S. PATENT DOCUMENTS 8,536,580 B2 9/2013 Kang
9,436,050 B2 9/2016 Ye
(Continued)

FOREIGN PATENT DOCUMENTS

KR 20150024729 A 3/2015
KR 1020170038326 A 4/2017
(Continued)

*Primary Examiner* — Galina G Yushina
(74) *Attorney, Agent, or Firm* — CANTOR COLBURN LLP

(57) ABSTRACT

A method of manufacturing a display device includes providing a transistor on a light-emitting area of a substrate, patterning a first organic layer covering the transistor to provide a first insulating layer, providing a pixel electrode connected to the transistor, and patterning a second organic layer covering the first insulating layer and the pixel electrode to provide a second insulating layer which defines the light-emitting area. The first insulating layer includes a first area corresponding to the light-emitting area, and a second area outside the light-emitting area and having a thickness which is less than a thickness of the first area, within the light-emitting area, the second insulating layer covers edges of the pixel electrode and covers external lateral surfaces of the first area of the first insulating layer, and a height of the second insulating layer decreases along a direction from the first area to the second area.

9 Claims, 7 Drawing Sheets

(51) Int. Cl.
*H10K 71/00* (2023.01)
*H10K 59/12* (2023.01)

(58) Field of Classification Search
CPC .... H10K 59/124; H10K 50/844; H10K 71/00; H10K 59/1201; H10K 2102/351
See application file for complete search history.

(56) References Cited

U.S. PATENT DOCUMENTS

| | | |
|---|---|---|
| 10,210,798 B2 | 2/2019 | Kim et al. |
| 2005/0082532 A1* | 4/2005 | Murakami ........... H10K 59/124 438/151 |
| 2013/0009162 A1 | 1/2013 | Kang ................. H01L 27/3246 257/72 |
| 2014/0217397 A1 | 8/2014 | Kwak ................. H01L 27/1218 257/43 |
| 2015/0060781 A1 | 3/2015 | Kang |
| 2015/0179728 A1 | 6/2015 | Kwon ................. H01L 27/3276 257/40 |
| 2016/0099296 A1* | 4/2016 | Jeon ..................... H10K 50/858 257/40 |
| 2016/0190213 A1* | 6/2016 | Kim ..................... H10K 59/124 257/40 |
| 2016/0190225 A1* | 6/2016 | Kim ..................... H10K 59/131 438/23 |
| 2016/0322451 A1 | 11/2016 | Park ....................... G09G 3/006 |
| 2017/0207416 A1 | 7/2017 | Kim et al. |
| 2017/0294425 A1 | 10/2017 | Kim ..................... H01L 51/0097 |
| 2018/0005568 A1 | 1/2018 | Kim ........................ H01L 51/50 |
| 2018/0006096 A1* | 1/2018 | Choi ..................... B32B 27/286 |

FOREIGN PATENT DOCUMENTS

| | | |
|---|---|---|
| KR | 101811027 B1 | 12/2017 |
| KR | 20180005097 A | 1/2018 |
| KR | 1020180059020 A | 6/2018 |
| KR | 101889873 B1 | 8/2018 |
| KR | 101890215 B1 | 8/2018 |

\* cited by examiner

DISPLAY DEVICE AND METHOD OF MANUFACTURING THE SAME

This application is a divisional application of U.S. application Ser. No. 16/598,604 filed Oct. 10, 2019, which claims priority to Korean Patent Application No. 10-2018-0147689, filed on Nov. 26, 2018, and all the benefits accruing therefrom under 35 U.S.C. § 119, the disclosure of which is incorporated herein in its entirety by reference.

BACKGROUND

1. Field

One or more embodiments relate to a display device and a method of manufacturing the same.

2. Description of the Related Art

In general, a display device has a structure in which various layers are stacked. For example, an organic light-emitting display device includes an organic light-emitting element which includes a pixel electrode, an intermediate layer including an organic emission layer, and an opposite electrode. In addition, a circuit unit driving the organic light-emitting element also has a structure in which a plurality of wirings are stacked, and insulating layers preventing an electrical short between the plurality of wirings layers may be between the plurality of wiring layers. The insulating layers may include or be formed of an inorganic material or an organic material.

SUMMARY

One or more embodiments include a display device, in which outgassing from an insulating layer including or formed of an organic material may be minimized, and a method of manufacturing the display device.

Additional features will be set forth in part in the description which follows and, in part, will be apparent from the description, or may be learned by practice of the presented embodiments.

According to one or more embodiments, a display device includes: a substrate includes a display area in which a light-emitting area is provided in plurality spaced apart from each other; a light-emitting element on the substrate, in the light-emitting area; a thin film transistor electrically connected to the light-emitting element; a first insulating layer between the light-emitting element and the thin film transistor; and a second insulating layer which defines the light-emitting area, the first insulating layer being between the thin film transistor and the second insulating layer. The first insulating layer includes a first area corresponding to the light-emitting area and a second area disposed outside the light-emitting area, the first area of the first insulating layer has a first thickness, and the second area of the first insulating layer has a second thickness which is less than the first thickness, in a same one light-emitting area, the second insulating layer covers a lateral surface of the first area of the first insulating layer, and a height of the second insulating layer decreases along a direction from the first area to the second area.

The first area of the first insulating layer may be provided in plurality respectively corresponding to the light-emitting area provided in plurality spaced apart from each other, and the second area of the first insulating layer may connect one of the first area of the first insulating layer to an adjacent one of the first area of the first insulating area.

The light-emitting element may include a pixel electrode disposed corresponding to the first area of the first insulating layer, and the second insulating layer may cover edges of the pixel electrode.

An upper surface of the first area of the first insulating layer may be planar.

The second insulating layer may expose an upper surface of the second area of the first insulating layer to outside the second insulating layer.

An end portion of the second insulating layer may expose the upper surface of the second area of the first insulating layer to outside the second insulating layer and have a concave curved surface.

The light-emitting element may include a common electrode in direct contact with the upper surface of the second area which is exposed to outside the second insulating layer.

The second insulating layer may extend from the first area to define an extension portion on the second area, and an upper surface of the extension portion which is furthest from the substrate may be closer to the substrate than an upper surface of the first area which is furthest from the substrate.

The first insulating layer and the second insulating layer may each include an organic material.

The second insulating layer may have a black color.

The display device may further include an encapsulation layer on the light-emitting element, and including a first inorganic encapsulation layer, an organic encapsulation layer, and a second inorganic encapsulation layer.

According to one or more embodiments, a method of manufacturing a display device, includes: providing a thin film transistor in a light-emitting area of a substrate; providing a first organic material layer covering the thin film transistor, and patterning the first organic material layer to provide a first insulating layer; providing a pixel electrode electrically connected to the thin film transistor; and providing a second organic material layer covering the first insulating layer and the pixel electrode, and patterning the second organic material layer to provide a second insulating layer which defines the light-emitting area. The first insulating layer includes: a first area corresponding to the light-emitting area and a second area disposed outside the light-emitting area, the second area having a thickness which is less than a thickness of the first area, within the light-emitting area, the second insulating layer covers edges of the pixel electrode and covers external lateral surfaces of the first area of the first insulating layer, and a height of the second insulating layer decreases along a direction from the first area to the second area.

The providing the second insulating layer may expose the pixel electrode. The method may further include: providing an intermediate layer including an organic emission layer on the pixel electrode which is exposed to outside the second insulating layer, and providing a common electrode on the intermediate layer.

The providing the second insulating layer may further expose an upper surface of the second area to outside the second insulating layer, and the providing the common electrode may dispose the common electrode in direct contact with the upper surface of the second area which is exposed to outside the second insulating layer.

The providing the second insulating layer may dispose an end portion of the second insulating layer in the second area of the first insulating layer and having a concave curved surface.

The providing the second insulating layer may dispose an extension portion of the second insulating layer covering the second area of the first insulating layer, and an upper surface of the extension portion which is furthest from the substrate, may be closer to the substrate than an upper surface of the first area of the first insulating layer which is furthest from the substrate.

An upper surface of the first area of the first insulating layer may be planar, and the providing the pixel electrode may dispose the pixel electrode on the upper surface of the first area of the first insulating layer which is planar.

The patterning the first organic material layer may use a first halftone mask, and may provide the first area and the second area of the first insulating layer simultaneously.

The patterning of the second organic material layer may use a second halftone mask, and may remove a portion of the second organic material layer corresponding to the second area of the first insulating layer.

The method may further include providing a first inorganic encapsulation layer, an organic encapsulation layer, and a second inorganic encapsulation layer on the common electrode.

In addition to the aforesaid details, other features, and advantages will be clarified from the following drawings, claims, and detailed description.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1A:
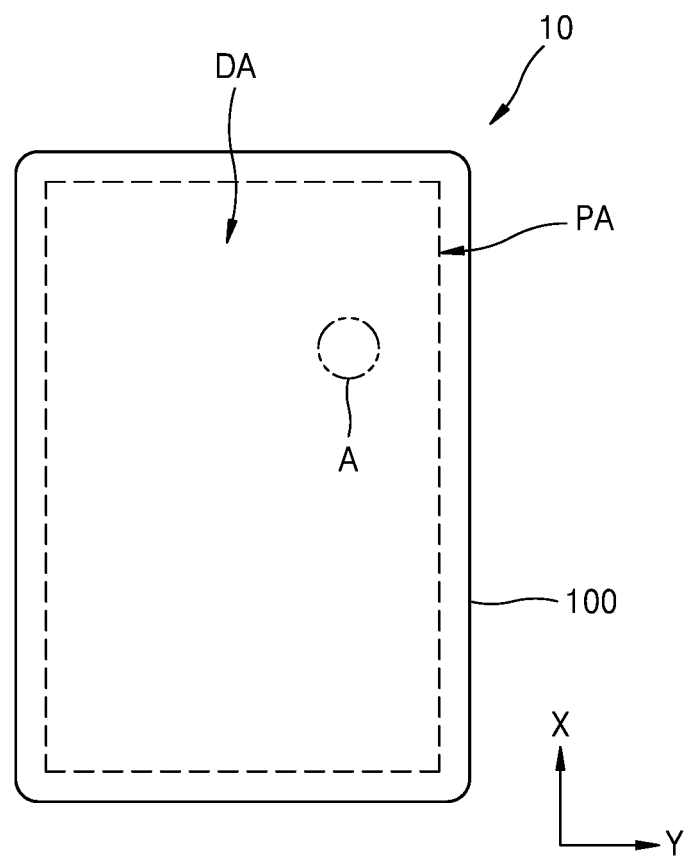
FIG. 1A and FIG. 1B are a schematic top plan view and an enlarged top plan view of an embodiment of a display device, respectively.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain features of the present description.

As used herein, the term "and/or" includes any and all combinations of one or more of the associated listed items. Expressions such as "at least one of," when preceding a list of elements, modify the entire list of elements and do not modify the individual elements of the list.

Since the present disclosure may have various modifications and several embodiments, embodiments are shown in the drawings and will be described in detail. Effects, features, and a method of achieving the same will be specified with reference to the embodiments described below in detail together with the attached drawings. However, the embodiments may have different forms and should not be construed as being limited to the descriptions set forth herein.

While such terms as "first," "second," etc., may be used to describe various components, such components must not be limited to the above terms. The above terms are used only to distinguish one component from another.

An expression used in the singular encompasses the expression of the plural, unless it has a clearly different meaning in the context. As used herein, the singular forms "a," "an," and "the" are intended to include the plural forms, including "at least one," unless the content clearly indicates otherwise.

In the present specification, it is to be understood that the terms such as "including" or "having" are intended to indicate the existence of the features or components disclosed in the specification, and are not intended to preclude the possibility that one or more other features or components may be added.

It will be understood that when a layer, region, or component is referred to as being related to another element such as being "on" another layer, region, or component, it may be directly or indirectly on the other layer, region, or component. That is, for example, intervening layers, regions, or components may be present. In contrast, when a layer, region, or component is referred to as being related to another element such as being "directly on" another layer, region, or component, no intervening layers, regions, or components are present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The embodiments will be described below in more detail with reference to the accompanying drawings. Those components that are the same or are in correspondence are rendered the same reference numeral regardless of the figure number.

In an insulating layer including or formed of an organic material, gas generated in the organic material may partially remain within stacked layers instead of being completely discharged during a manufacturing process of a display device. Thus, outgassing may occur from the insulating layer including or formed of an organic material during use of the display device. In addition, when a display device is used outdoors for a relatively long period of time, the insulating layer including or formed of an organic material may be decomposed by sunlight, and gas may be generated during the decomposition process. When gas is generated from decomposition of an insulating layer including or formed of an organic material, the gas may deteriorate an organic emission layer within an organic light-emitting element, which causes defects such as pixel shrinkage, thereby degrading the reliability of a display device.

Figure 1B:
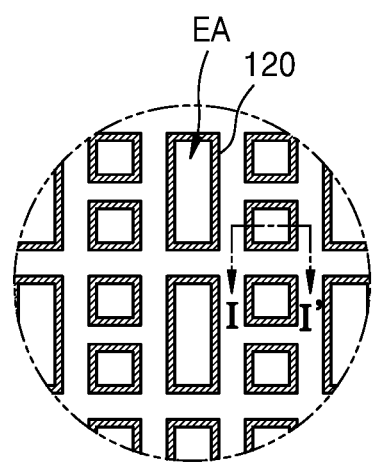
Figure 2:
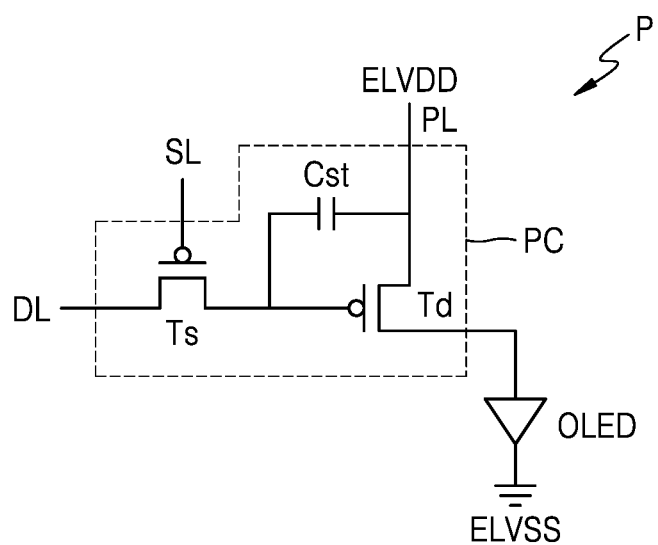
FIG. 2 is an equivalent circuit diagram of an embodiment of a pixel of a display device.

FIG. 1A and FIG. 1B are a schematic top plan view and an enlarged top plan view of an embodiment of a display device 10. FIG. 2 is an equivalent circuit diagram of an embodiment of a pixel P included in the display device 10.

Referring to FIGS. 1A, 1B and 2, the display device 10 includes a display area DA where an image is displayed, and a peripheral area PA which is adjacent to the display area DA and where an image is not displayed. The display device 10 includes a substrate 100. It may also be understood that a substrate 100 includes the display area DA and the peripheral area PA corresponding to those areas described above for display device 10 overall. The substrate 100 in FIG. 1A may represent a general display substrate of the display device 10 overall, or may represent a base substrate on which various layers are stacked within the general display substrate.

A light-emitting area EA may be provided in the display area DA. More than one of the light-emitting area EA may be spaced apart from each other along a first direction X and along a second direction Y which crosses the first direction X. The more than one of the light-emitting area EA and may have planar sizes equal to each other or planar sizes different from each other. In addition, the more than one of the light-emitting area EA may be disposed along lines which are parallel to each other in the first direction X and/or the second direction Y, or may be arranged in a staggered manner with respect to each other, or in other various arrangements.

At least one light-emitting element is provided in each light-emitting area EA to emit light of a red color, a blue color, a green color or a white color. The more than one of the light-emitting area EA may be partitioned along the first direction X and/or along the second direction Y by a second insulating layer 120. Thus, in the display device 10, one of the light-emitting area EA may be or define a pixel P of the display device. The pixel P described herein may also represent a sub-pixel of the display device, within a general pixel. FIG. 2 illustrates an example of an equivalent circuit diagram of the pixel P. Referring to FIG. 2, the pixel P may include a pixel circuit PC connected to a scan line SL as a signal line and a data line DL as a signal line, and a light-emitting element which is connected to the pixel circuit PC. The light-emitting element may include, for example, an organic light-emitting element OLED.

The pixel circuit PC may include a driving thin film transistor Td, a switching thin film transistor Ts, and a storage capacitor Cst. The switching thin film transistor Ts is connected to the scan line SL and the data line DL, and may transfer a data signal input via the data line DL, to the driving thin film transistor Td, according to a scan signal input via the scan line SL. The storage capacitor Cst is connected to the switching thin film transistor Ts and a driving voltage supply line PL, and may store a voltage corresponding to a difference between a voltage received from the switching thin film transistor Ts and a driving voltage ELVDD supplied to the driving voltage supply line PL.

The driving thin film transistor Td is connected to the driving voltage supply line PL and the storage capacitor Cst, and may control, in accordance with a voltage value stored in the storage capacitor Cst, an electrical driving current flowing from the driving voltage supply line PL through the organic light-emitting element OLED. The organic light-emitting element OLED may emit light having certain brightness via the electrical driving current. The organic light-emitting element OLED may emit, for example, light of a red color, a green color, a blue color or a white color.

While the pixel P including two thin film transistors and one storage capacitor is described with reference to FIG. 2, the present disclosure is not limited thereto. According to another embodiment, other various modifications may be made, for example, a pixel circuit PC of a pixel P may include three or more thin film transistors and two or more storage capacitors.

Referring back to FIGS. 1A and 1B, the peripheral area PA may surround the display area DA. The peripheral area PA is an area of the display device 10 and/or the substrate 100 at which one or more of the pixel P is not provided. The peripheral area PA corresponds to a non-display area of the display device 10 and/or the substrate 100 at which no image is provided. The peripheral area PA may include a pad area in which various electronic devices and/or a printed circuit board or the like are electrically attached, at which a plurality of signal wirings via which an electrical signal is to be applied to one or more of the light-emitting element respectively provided in the light-emitting area EA, or the like. In an embodiment, the electrical signal may be provided to the peripheral area from outside the display device 10, through the pad area, the signal wirings, etc.

Figure 3:
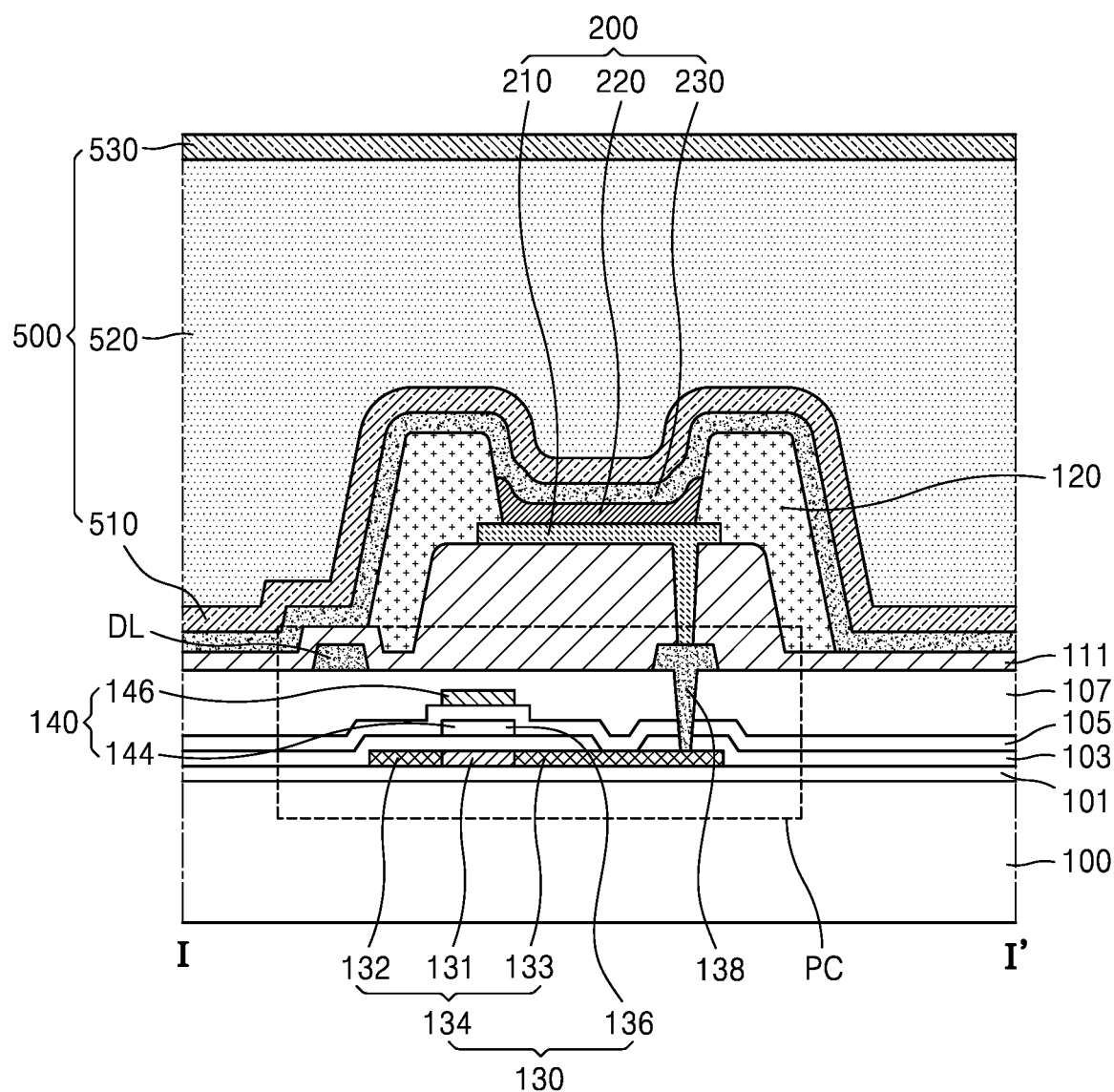
FIG. 3 is an enlarged cross-sectional view taken along line I-I' of FIG. 1B.
Figure 4:
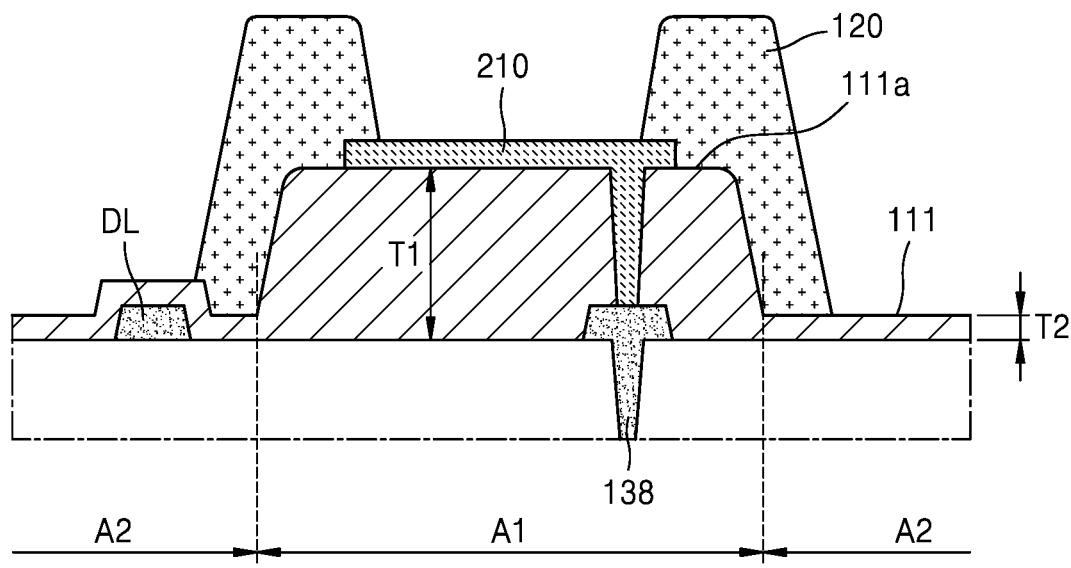
FIGS. 4 through 6 are enlarged cross-sectional views illustrating embodiments of elements of the display device of FIGS. 1A and 1B.
Figure 5:
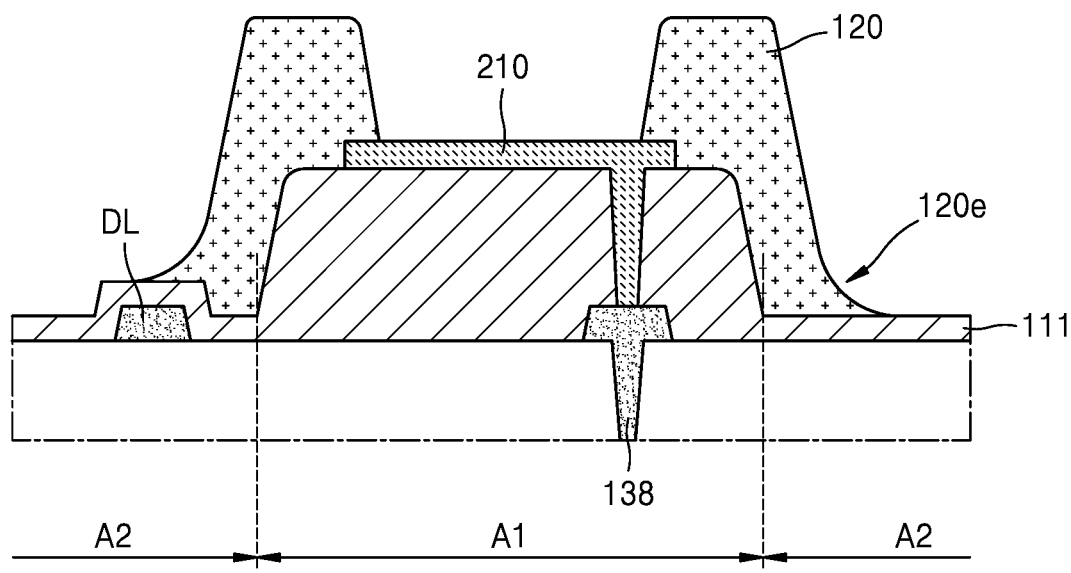
Figure 6:
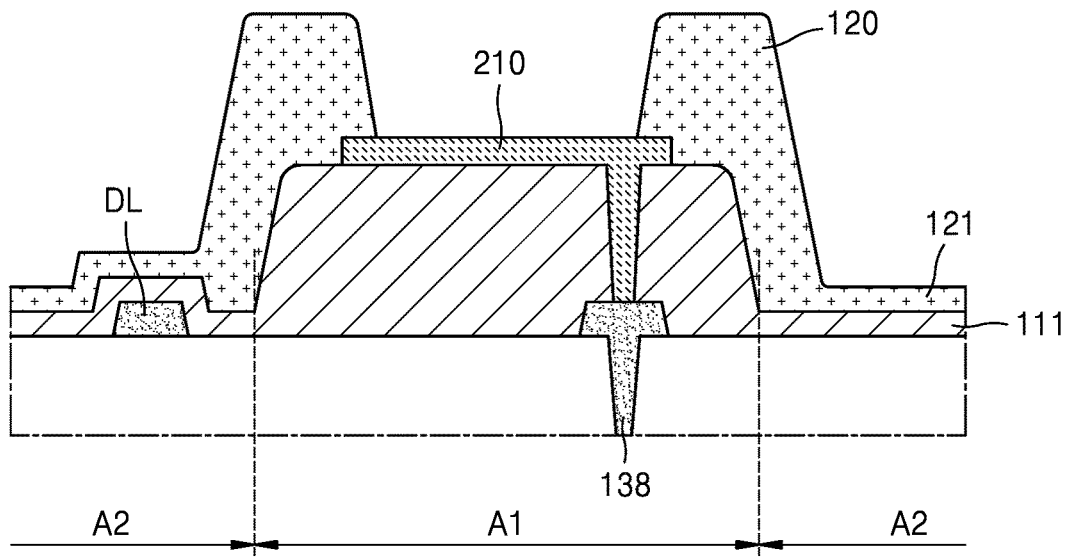

FIG. 3 is an enlarged cross-sectional view taken along line I-I' of FIG. 1B. FIGS. 4 through 6 are enlarged cross-sectional views illustrating embodiment of elements of the display device 10 of FIGS. 1A and 1B. Hereinafter, while FIGS. 4 through 6 respectively illustrate cross-sections of a display device corresponding to the cross-section I-I' shown in FIG. 3, for convenience of description, a first insulating layer 111 and the second insulating layer 120 from among the elements illustrated in FIG. 3 are mainly illustrated and other elements are omitted. A thickness of the display device 10, the substrate 100 and/or elements respectively thereof extends along a third direction which crosses each of the first direction X and the second direction Y. In FIG. 3, the vertical direction may represent the third direction, and the horizontal direction may represent the first direction X and/or the second direction Y.

Referring to FIG. 3, a thin film transistor 130, a light-emitting element 200 electrically connected to the thin film transistor 130, and the first insulating layer 111 that is between the thin film transistor 130 and the light-emitting element 200 and has a thickness varying according to positions along the substrate 100, may be provided on the substrate 100 as a base substrate. The light-emitting element 200 may include, for example, an organic light-emitting element OLED, and the thin film transistor 130 may correspond to the driving thin film transistor Td of the pixel circuit PC described with reference to FIG. 2. In addition, a storage capacitor 140 illustrated in FIG. 3 corresponds to the storage capacitor Cst described with reference to FIG. 2. While the switching thin film transistor Ts (FIG. 2) is not illustrated in FIG. 3, the switching thin film transistor Ts (FIG. 2) is included in the pixel circuit PC as described above.

The substrate 100 may include a glass material including $SiO_2$ as a main component. However, the substrate 100 is not limited thereto, and may also include or be formed of a transparent plastic material. The substrate 100 may include or be formed of a plastic material that is an insulating organic material. In an embodiment, for example, the insulating organic material may be selected from among a polyether sulfone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide, polycarbonate ("PC"), cellulose triacetate ("TAC"), and cellulose acetate propionate ("CAP").

In a bottom emission type display device in which an image is realized toward the substrate 100 (e.g., visible at the side of the substrate 100), the substrate 100 includes or is formed of a transparent material. However, in a top emission type display device in which an image is realized in a direction away from the substrate 100, the substrate 100 may not include or be formed of a transparent material. In a top emission type display device, for example.

The substrate 100 may include be formed of a metal material. When the substrate 100 includes or is formed using a metal material, the substrate 100 may include at least one material selected from among carbon, iron, chromium, manganese, nickel, titanium, molybdenum, and stainless steel ("SUS"), but is not limited thereto.

A buffer layer 101 may be disposed or formed on the substrate 100. The buffer layer 101 may reduce or effectively prevent foreign substances or moisture penetrating through the substrate 100 from reaching other layers stacked on the substrate 100. The buffer layer 101 may include an inorganic material such as silicon oxide, silicon nitride, silicon oxynitride, aluminum oxide, aluminum nitride, titanium oxide or titanium nitride, or an organic material such as polyimide, polyester or acrylic, or of a structure in which a plurality of the described materials are stacked. The buffer layer 101 may be disposed or formed over each of the display area DA and the peripheral area PA.

The thin film transistor 130 may include an active layer 134 and a gate electrode 136, and a gate insulating layer 103 disposed between the active layer 134 and the gate electrode 136.

The active layer 134 may include a semiconductor material, for example, amorphous silicon or polycrystalline silicon. However, the embodiment is not limited thereto, and the active layer 134 may include various materials. According to an embodiment, the active layer 134 may include an organic semiconductor material or the like. According to another embodiment, the active layer 134 may include an oxide semiconductor material. In an embodiment, for example, the active layer 134 may include a Group 12, 13 or 14 metal element such as zinc (Zn), indium (In), gallium (Ga), tin (Sn), cadmium (Cd), and germanium (Ge) and an oxide of a material selected from a combination of the metal elements.

The active layer 134 may include or define a channel area 131 overlapping the gate electrode 136, and a source area 132 and a drain area 133 which are respectively disposed on opposing sides of the channel area 131 and doped with an impurity having a higher density than an impurity doped in the channel area 131. The impurity may include an N-type impurity or a P-type impurity.

The gate electrode 136 may be connected to a signal line such as a gate line or a scan line via which an on/off signal is applied to the thin film transistor 130. The gate electrode 136 may include or be formed of a relatively low-resistance metal material. The gate electrode 136 may include, for example, one or more materials selected from among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), and may have a single-layer structure or multi-layer structure.

The gate insulating layer 103 between the active layer 134 and the gate electrode 136 may reduce or effectively prevent an electrical short between the active layer 134 and the gate electrode 136. The gate insulating layer 103 may include an inorganic insulating layer such as silicon oxynitride (SiON), silicon oxide (SiOx), and/or silicon nitride (SiNx), and the inorganic insulating layer may be a single-layer structure or a multi-layer structure.

A first interlayer insulating layer 105 may be disposed on the gate electrode 136. The first interlayer insulating layer 105 is a layer having a certain permittivity, and may include a single-layer structure or a multi-layer structure where each layer includes or is formed of an inorganic material. In an embodiment, for example, the inorganic material may be a metal oxide or a metal nitride, and in detail, the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), or hafnium oxide ($HfO_2$) or the like.

A bottom electrode 144 and a top electrode 146 of the storage capacitor 140 may overlap each other with the first interlayer insulating layer 105 therebetween. In an embodiment, for example, the bottom electrode 144 of the storage capacitor 140 may be the gate electrode 136 of the thin film transistor 130. Accordingly, the storage capacitor 140 may overlap the thin film transistor 130. However, the embodiment is not limited thereto. According to another embodiment, the storage capacitor 140 may not overlap the thin film transistor 130, and the bottom electrode 144 may be a separate element that is independent of the gate electrode 136 of the thin film transistor 130.

The storage capacitor 140 may be covered by a second interlayer insulating layer 107. The second interlayer insulating layer 107 may include or be formed of an inorganic material in a single-layer structure or a multi-layer structure. In an embodiment, for example, the inorganic material may be a metal oxide or a metal nitride, and in detail, the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), or hafnium oxide ($HfO_2$) or the like.

A data line DL, a source electrode (not shown) and a drain electrode 138 of the thin film transistor 130 or the like may be disposed on the second interlayer insulating layer 107. The source electrode and the drain electrode 138 of the thin film transistor 130 may be respectively connected to the source area 132 and the drain area 133 of the active layer 134. In addition, one of the source electrode and the drain electrode 138 of the thin film transistor 130 may be electrically connected to a pixel electrode 210 of the light-emitting element 200 as described later. The source electrode may be a portion of the data line DL, but is not limited thereto.

The source electrode and the drain electrode 138 may include, for example, one or more materials selected from among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), and may be disposed or formed as a single-layer structure or a multi-layer structure. In an embodiment, for example, the source electrode and the drain electrode 138 may have a three-layer stacked structure including titanium (Ti), aluminum (Al), and titanium (Ti).

The pixel circuit PC may further include the switching thin film transistor Ts (FIG. 2) as described above. Here, the active layer 134 of the thin film transistor 130 and an active layer of the switching thin film transistor Ts (FIG. 2) may include different materials from each other. In an embodiment, for example, one of the active layer 134 of the thin film transistor 130 and the active layer of the switching thin film transistor Ts (FIG. 2) may include an oxide semiconductor, and the other may include polysilicon.

The first insulating layer 111 is provided on the thin film transistor 130. The first insulating layer 111 may include, for example, an organic insulating material. Examples of the organic insulating material may include imide polymers, general-use polymers such as polymethylmethacrylate ("PMMA") and polystyrene ("PS"), polymer derivatives having a phenolic group, acrylic polymers, aryl ether polymers, amide polymers, fluorine polymers, p-xylene polymer, a vinyl alcohol-based polymer, and a blend thereof. According to an embodiment, the first insulating layer 111 may include polyimide.

The first insulating layer 111 may be disposed or formed over the display area DA and over the peripheral area PA. As illustrated in FIG. 4, the first insulating layer 111 may include, at least in the display area DA, more than one of a first area A1 spaced apart from each other and more than one of a second area A2 each having a different thickness from each of the first area A1. The second area A2 may be between two of the first area A1 which are adjacent to each other and have a shape or structure which connects the two of the first area A1 to each other.

A first thickness T1 of the first insulating layer 111 in each first area A1 may be greater than a second thickness T2 the first insulating layer 111 in the second area A2. When a lateral or side surface of the first insulating layer 111 in the first area A1 is tapered, the first area A1 is defined along the substrate 100 as a planar area between points where a thickness of the first insulating layer 111 increases from the second thickness T2. The first thickness T1 the first insulating layer 111 may be maximum in the first area A1. When the first insulating layer 111 extends from the display area DA to the peripheral area PA, a thickness of the first insulating layer 111 in the peripheral area PA may be equal to the second thickness T2.

More than one of the first area A1 is provided to respectively correspond to the more than one of the light-emitting area EA. That is, in each first area A1, at least one of the light-emitting element 200 may be provided. The first insulating layer 111 has the first thickness T1 corresponding to the thin film transistor 130. Since the first thickness T1 of the first insulating layer 111 covers elements of the thin film transistor 130, a height difference or stepped structure due to the elements of the thin film transistor 130 or the like may be removed and thus the first insulating layer 111 at the first area A1 may have a planar upper surface 111a. Accordingly, defects caused in the light-emitting element 200 disposed corresponding to the first area A1 of the first insulating layer 111 due to unevenness of elements of the thin film transistor 130 at a lower portion of the stacked structure on the substrate 100, may be reduced or effectively prevented. In an embodiment, for example, the first thickness T1 of the first insulating layer 111 at the first area A1 thereof may be about 1 micrometer (μm) to about 1.5 micrometers (μm).

The first insulating layer 111 at the second area A2 thereof may cover wirings and other elements disposed on the substrate 100 at the second area A2, such as the data line DL, and protect such elements. The second thickness T2 of the second area A2 may be about 2000 angstroms (Å) to about 3000 Å to reduce or effectively prevent an electrical short between the wirings on the second interlayer insulating layer 107 under the first insulating layer 111, and a common electrode 230 which is above the first insulating layer, to minimize a total volume of the first insulating layer 111 within the display device 10.

The light-emitting element 200 including the pixel electrode 210, the common electrode 230, and an intermediate layer 220 between the pixel electrode 210 and the common electrode 230 and including an emission layer, may be provided on the first insulating layer 111 at the first area A1 thereof. In an embodiment, for example, the light-emitting element 200 may include an organic light-emitting element OLED (FIG. 2) including an organic emission layer.

The pixel electrode 210 is provided corresponding to the first area A1 and may be electrically connected to the thin film transistor 130. The pixel electrode 210 may be, for example, a reflective electrode. In an embodiment, for example, the pixel electrode 210 may include a reflective layer including or formed of Ag, Mg, Al, Pt, Pd, Au, Ni, Nd, Ir, Cr or a compound thereof, and a transparent or semi-transparent electrode layer on the reflective layer. The transparent or semi-transparent electrode layer may include at least one selected from among indium tin oxide ("ITO"), indium zinc oxide ("IZO"), zinc oxide ("ZnO"), indium oxide ($In_2O_3$), indium gallium oxide ("IGO"), and aluminum zinc oxide ("AZO").

In contrast to the pixel electrode 210 being a reflective electrode, the common electrode 230 may be a transparent or semi-transparent electrode and include a metal thin film having a relatively small work function, that is, Li, Ca, LiF/Ca, LiF/Al, Al, Ag, Mg, and a compound thereof. In addition, an auxiliary electrode layer or a bus electrode may be further provided or formed on the metal thin film and of a material for forming a transparent electrode, such as ITO, IZO, ZnO, $In_2O_3$, or the like. Thus, light emitted from the organic emission layer included in the intermediate layer 220 may pass through the common electrode 230. That is, light emitted from the organic emission layer may be directly emitted to the common electrode 230 or may be reflected by the pixel electrode 210 including a reflective electrode, toward the common electrode 230.

However, the display device 10 according to the present embodiment is not limited to a front emission type, and may also be a bottom emission type in which light emitted from an organic emission layer is emitted toward the substrate 100. In this case, the pixel electrode 210 may include a transparent or semi-transparent electrode, and the common electrode 230 may include a reflective electrode. In addition, the display device 10 according to the embodiment may also be a dual emission type in which light is emitted in two directions, toward the front of the display device 10 at a side of the light-emitting element 200 and toward the back at a side of the substrate 100.

The second insulating layer 120 is disposed on the pixel electrode 210. The second insulating layer 120 may include or be formed of at least one organic insulating material selected from among polyimide, polyamide, an acrylic resin, benzocyclobutene and a phenolic resin. The second insulating layer 120 may include or be formed by using a method such as spin coating. The second insulating layer 120 may define an opening at which a center portion of the pixel electrode 210 is exposed. The opening defined by the second insulating layer 120 may define the light-emitting area EA. In addition, by covering outer edges of the pixel electrode 210, the second insulating layer 120 may increase a distance between the outer edges of the pixel electrode 210 and the common electrode 230 (FIG. 3) along a thickness direction to thereby reduce or effectively prevent an electrical arc or the like therebetween.

As illustrated in FIG. 4, the second insulating layer 120 covers an outer lateral or side surface of the first insulating layer 111 at the first area A1 thereof. The second insulating layer 120 may extend along the substrate 100 from the outer lateral or side surface of the first insulating layer 111 at one of the light-emitting area EA, to terminate a distance from the outer lateral or side surface of the first insulating layer 111. The second insulating layer 120 extends from the one of the light-emitting area EA toward another one of the light-emitting area EA, along the substrate 100. That is, the second insulating layer 120 may be absent between two adjacent ones of the light-emitting area EA. Thus, the second insulating layer 120 may have a barrier shape surrounding one light-emitting area EA. In detail, a height of the second insulating layer 120 along a thickness direction may decrease from the first area A1 of the first insulating layer 111 to the second area A2 thereof. In an embodiment, for example, the second insulating layer 120 is absent at a center portion of the second area A2 of the first insulating layer 111, and thus, an upper surface of the first insulating layer 111 at the second area A2 thereof may be exposed outside of the second insulating layer 120. As a result, the second area A2 of the first insulating layer 111 may be in direct contact with the common electrode 230 as described later.

As described above, the first insulating layer 111 and the second insulating layer 120 both include an organic insulating material. When a portion of the second insulating layer 120 is absent from the second area A2 where the first insulating layer 111 has the second thickness T2, an amount of an organic material between the two adjacent ones of the light-emitting area EA may be minimized. As a result, a total volume of an organic material in the display device 10 is reduced and thus outgassing of the organic material may be minimized, thereby reducing and/or effectively preventing defects such as pixel shrinkage of the display device 10 due to outgassing. Moreover, even when the display device 10 is exposed to sunlight for a relatively long period of time, an amount of the organic material which is decomposable by sunlight may be reduced, and thus the reliability of the display device 10 may be increased.

The second insulating layer 120 may have a black color and may reduce light incident to other layers stacked on the substrate 100. In an embodiment, for example, the second insulating layer 120 may include carbon black or the like. When the second insulating layer 120 has a black color, due to light absorption of the second insulating layer 120, decomposition of an organic material in the display device 10 by sunlight may be reduced or effectively prevented. Moreover, by using the second insulating layer 120 having a barrier shape, mixture of colors or leakage of light may be reduced or effectively prevented.

Referring back to FIG. 3, the intermediate layer 220 is provided in the opening of the second insulating layer 120 exposing the pixel electrode 210. The intermediate layer 220 may include a relatively low-molecular weight or polymer material. When the intermediate layer 220 includes a relatively low-molecular weight material, the intermediate layer 220 may include a hole injection layer ("HIL"), a hole transport layer ("HTL"), an emission layer ("EML"), an electron transport layer ("ETL"), an electron injection layer ("EIL"), or the like in a single-layer structure or a complex and stacked structure. When the intermediate layer 220 includes a relatively low-molecular weight material, the intermediate layer 220 may include copper phthalocyanine (CuPc), N,N'-Di(naphthalene-1-yl)-N,N'-diphenyl-benzidine (NPB), tris-8-hydroxyquinoline aluminum (Alq3) or other various organic materials. The above-described layers may be formed using a vacuum deposition method.

When the intermediate layer 220 includes a polymer material, the intermediate layer 220 may have a structure including a hole transport layer ("HTL") and an emission layer ("EML"). The HTL may include PEDOT, and the EML may include a polymer material such as a poly-phenylenevinylene-based material or a polyfluorene-based material. The structure of the intermediate layer 220 is not limited to the above described one, and may be various ones. In an embodiment, for example, at least one of the layers included in the intermediate layer 220 may be integrally formed over more than one of the pixel electrode 210, so as to be common to more than one of the light-emitting area EA. Alternatively, the intermediate layer 220 may include a layer patterned to discretely correspond to each pixel electrode 210.

In addition, the common electrode 230 may be disposed on the display area DA and disposed to cover the display area DA. That is, the common electrode 230 may be integrally formed with respect to more than one of the light-emitting element 200, so as to be common to more than one of the light-emitting area EA.

As illustrated in FIG. 4, the second insulating layer 120 having a barrier shape may cover an external lateral surface of the first insulating layer 111 at the first area A1 thereof, thus alleviating a height difference that may be formed at the outer side of the first area A1. Accordingly, damage to the common electrode 230 due to the height difference, such as cracks, may be reduced or effectively prevented. In an embodiment, for example, when the second insulating layer 120 is provided only on the first insulating layer 111 in the first area A1 thereof, to terminate at the first area A1 of the first insulating layer 111 and to not extend into the second area A2 thereof, forming an external lateral surface of the first insulating layer 111 at the first area A1 to be flush with an external lateral surface of the second insulating layer 120 may be difficult, and as a result, an abrupt step difference may be generated between the external lateral surface of the first insulating layer 111 at the first area A1 and the external lateral surface of the second insulating layer 120. Moreover, as the first insulating layer 111 has the second thickness T2 in the second area A2, planarizing uneven portions under the first insulating layer 111 may be difficult, and accordingly, an abrupt step difference may be generated at a boundary between the external lateral surface of the first insulating layer 111 at the first area A1 thereof and the first insulating layer 111 at the second area A2 due to elements disposed under the first insulating layer 111 to define a lower uneven structure. However, when the second insulating layer 120 covers the external lateral surface of the first insulating layer 111 the first area A1 thereof and extends to portions of the first insulating layer 111 at the second area A2 thereof, a height difference that may be generated on the outer side of the first insulating layer 111 at the first area A1 thereof may be alleviated, and thus, damage to the common electrode 230 due to the height difference may be reduced or effectively prevented.

While the external lateral surface of the second insulating layer 120 is illustrated in FIG. 4 as having a certain inclination in cross-section, the present disclosure is not limited thereto. In an embodiment, for example, as illustrated in FIG. 5, the external lateral surface of the second insulating layer 120 may have a smooth curved surface. In detail, an outer end portion 120e of the second insulating layer 120 disposed at the second area A2 of the first insulating layer 111 and terminating to expose the first insulating layer 111 at the second area A2 thereof, may have a concave shape to thereby prevent a sharp bent shape of the common electrode 230 provided over the second insulating layer 120 at a point where the outer end portion 120e of the second insulating layer 120 meets the first insulating layer 111 at the second area A2 thereof.

In addition, as illustrated in FIG. 6, the second insulating layer 120 may further include an extension portion 121 provided on the first insulating layer 111 at the second area A2 thereof. When the second insulating layer 120 includes the extension portion 121, a single one of the second insulating layer 120 which partitions two adjacent ones of the light-emitting area EA are connected to each other via the extension portion 121. That is, the first insulating layer 111 is not exposed from the second insulating layer 120 at the second area A2 of the first insulating layer 111. Thus, the second insulating layer 120 may have an overall similar planar shape to that of the first insulating layer 111. The extension portion 121 may protect the first insulating layer 111 in the second area A2 and the wirings disposed directly below the first insulating layer 111 in the second area A2. The extension portion 121 may have an equal or similar thickness to that of the first insulating layer 111 in the second area A2 to minimize a total volume of an organic material in the display device 10. Thus, an upper surface of the extension portion 121 which is furthest from the substrate 100, may still be closer to the substrate 100 than an upper surface of the first insulating layer 111 in the first area A1 which is furthest from the substrate 100.

Referring back to FIG. 3, an encapsulation layer 500 protecting the light-emitting element 200 from moisture or oxygen incident from outside the encapsulation layer 500 may be provided on the common electrode 230. The encapsulation layer 500 may have a planar shape extending to the display area DA where the light-emitting element 200 is provided and even to the peripheral area PA which is outside the display area DA. The encapsulation layer 500 may have a multi-layer structure. In an embodiment, for example, as illustrated in FIG. 3, the encapsulation layer 500 may include a first inorganic encapsulation layer 510, an organic encapsulation layer 520, and a second inorganic encapsulation layer 530.

The first inorganic encapsulation layer 510 covers the common electrode 230, and may include silicon oxide, silicon nitride and/or silicon oxynitride or the like. As the first inorganic encapsulation layer 510 is provided or formed according to an underlying profile or structure therebelow, an upper surface of the first inorganic encapsulation layer 510 may not be planar as illustrated in FIG. 3. Here, as described above, the second insulating layer 120 having a barrier shape may cover the external lateral surface of the first insulating layer 111 in the first area A1 to alleviate a height difference that may be generated at the outer side of the first area A1, thus reducing or effectively preventing damage to the first inorganic encapsulation layer 510 due to the height difference.

The organic encapsulation layer 520 covers the first inorganic encapsulation layer 510 and has a sufficient thickness such as to planarize the layers disposed thereunder. Thus, an upper surface of the organic encapsulation layer 520 which is furthest from the substrate 100 may be substantially planar over the entire display area DA. The organic encapsulation layer 520 may include at least one material selected from among polyethylene terephthalate, polyethylene naphthalate, polycarbonate, polyimide, polyethylene sulfonate, polyoxymethylene, polyarylate, and hexamethyldisiloxane.

The second inorganic encapsulation layer 530 may cover the organic encapsulation layer 520 and may include silicon oxide, silicon nitride and/or silicon oxynitride or the like. The second inorganic encapsulation layer 530 may extend further than an outer edge of the organic encapsulation layer 520, to dispose a portion of the second inorganic encapsulation layer 530 outside the organic encapsulation layer 520 to contact the first inorganic encapsulation layer 510, thereby reducing or effectively preventing the organic encapsulation layer 520 from being exposed to outside the encapsulation layer 500.

As the encapsulation layer 500 includes the first inorganic encapsulation layer 510, the organic encapsulation layer 520, and the second inorganic encapsulation layer 530, even when a crack is generated in the encapsulation layer 500, by using the multi-layer structure as described above, the crack may not be connected between the first inorganic encapsulation layer 510 and the organic encapsulation layer 520 or between the organic encapsulation layer 520 and the second inorganic encapsulation layer 530. Accordingly, a path through which water, oxygen, etc. from outside the encapsulation layer 500 penetrates into the display area DA may be minimized or effectively prevented.

Figure 7:
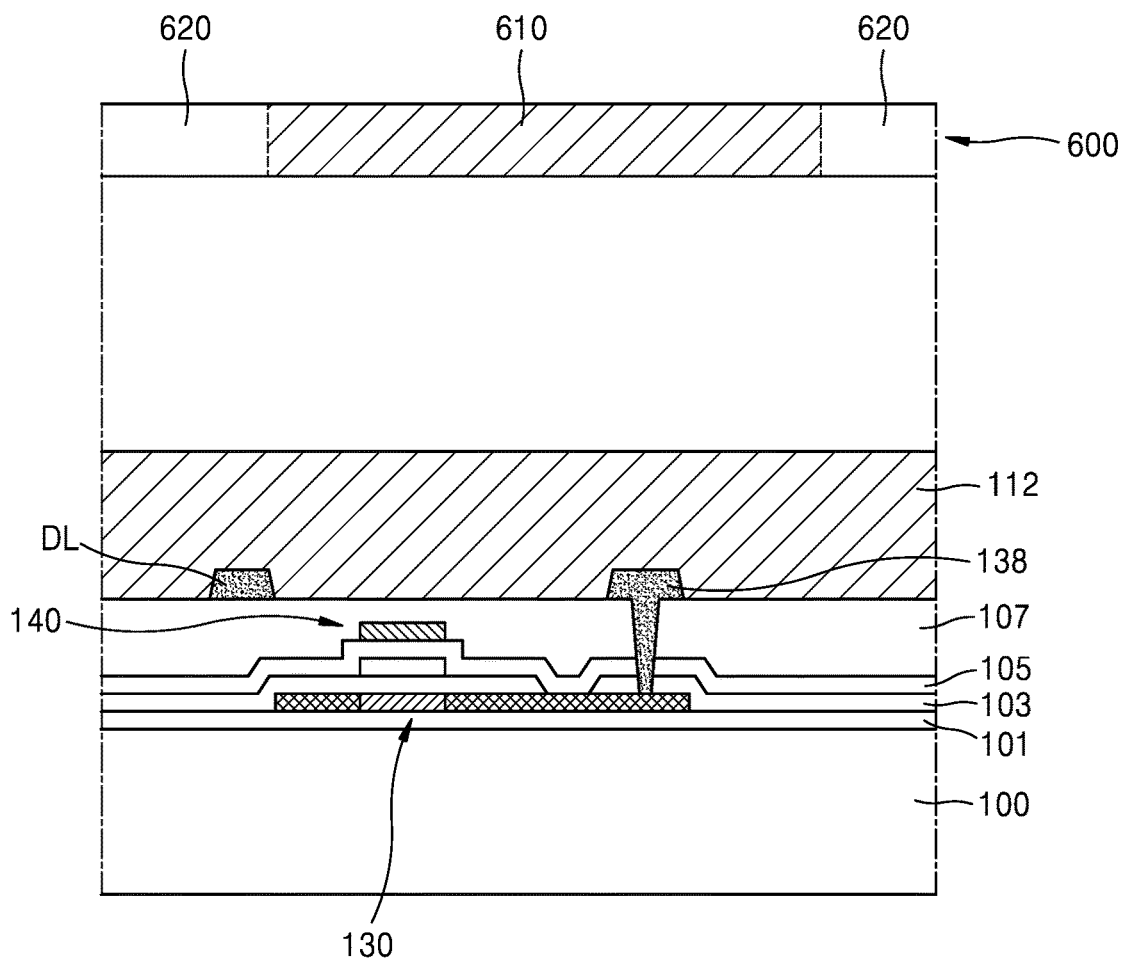
FIGS. 7 through 9 are enlarged cross-sectional views illustrating structures of a display device in an embodiment of a method of manufacturing the display device of FIGS. 1A and 1B.
Figure 8:
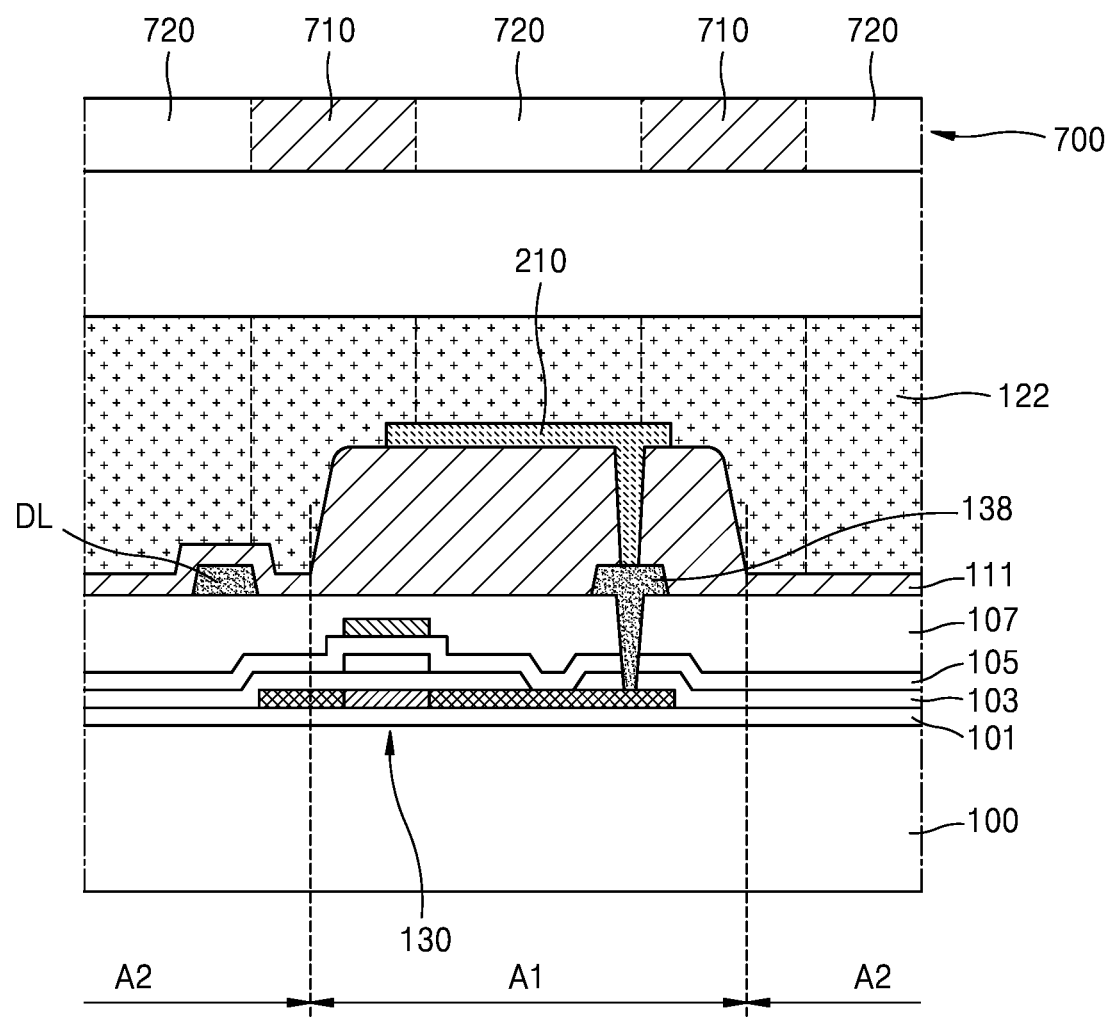
Figure 9:
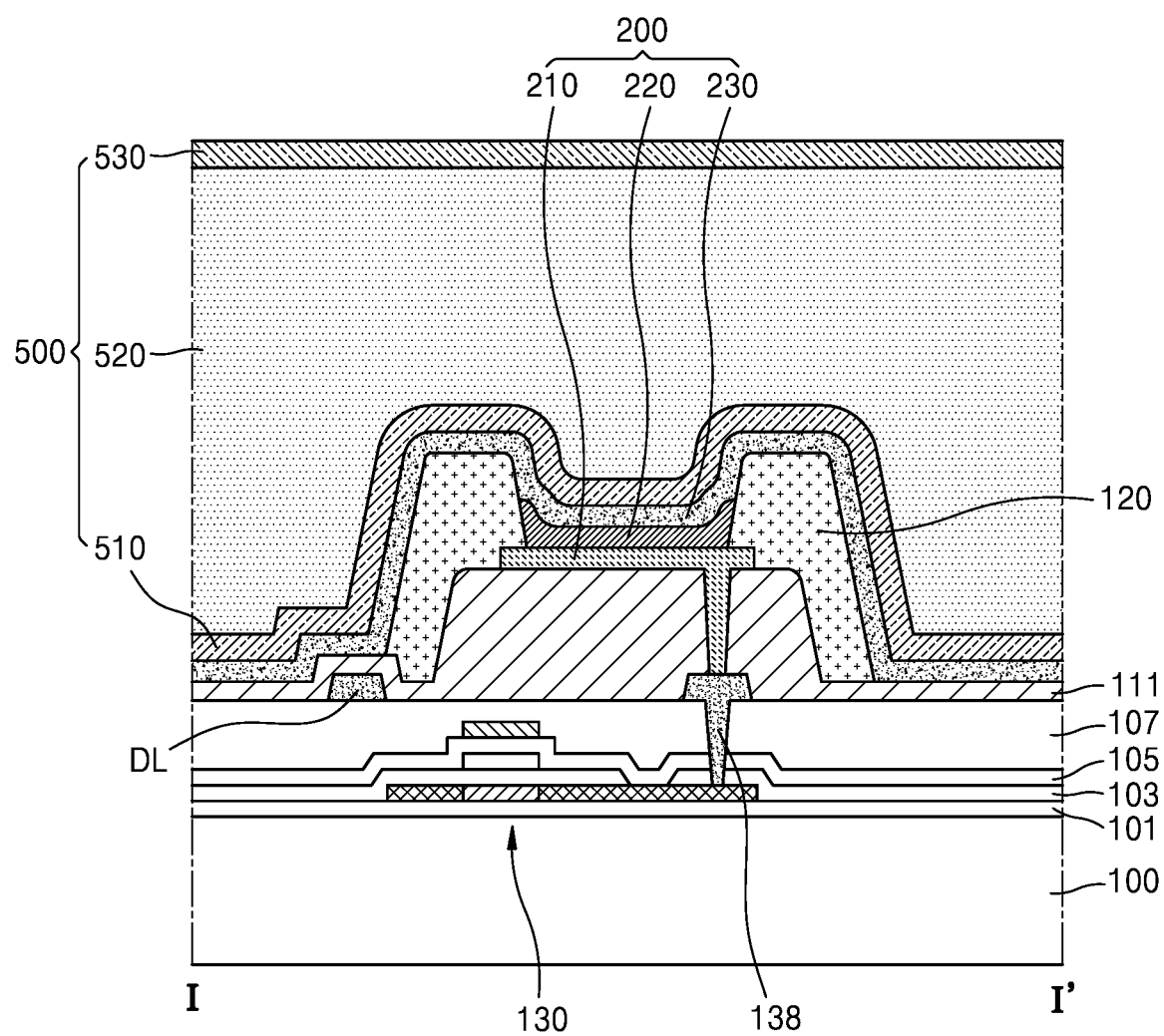

FIGS. 7 through 9 are enlarged cross-sectional views illustrating structures of a display device in an embodiment of a method of manufacturing the display device 10 of FIGS. 1A and 1B.

Referring to FIGS. 7 through 9, the method of manufacturing a display device includes providing or forming a thin film transistor 130 on a substrate 100, providing or forming a first organic material layer 112 covering the thin film transistor 130, and patterning the first organic material layer 112 to form a first insulating layer 111 including a first area A1 and a second area A2, providing or forming a pixel electrode 210 on the first insulating layer 111 in the first area A1, and providing or forming a second organic material layer 122 on the pixel electrode 210 and patterning the second organic material layer 122 to form a second insulating layer 120.

During providing or forming of the thin film transistor 130 on the substrate 100, a storage capacitor 140 or the like is also provided or formed, and a data line DL, and a source electrode and a drain electrode 138 of the thin film transistor 130 are provided or formed on the second interlayer insulating layer 107 covering the storage capacitor 140. The first organic material layer 112 may be provided or formed on the second interlayer insulating layer 107 to cover the data line DL, and the source electrode and the drain electrode 138 of the thin film transistor 130.

The first insulating layer 111 may be provided or formed by a photolithography process of exposing the first organic material layer 112 using a first halftone mask 600 and then developing and removing portions of the first organic material layer 112 which is exposed.

Referring to FIG. 7, the first halftone mask 600 may include a light transmitting portion 610 and a semi-transmitting portion 620. The light transmitting portion 610 is a region through which light is transmitted about 100% and is provided or formed to correspond to the first area A1 of the first insulating layer 111. The semi-transmitting portion 620 is a region through which light is partially transmitted, and may be provided or formed to correspond to the second area A2 of the first insulating layer 111. A light transmittance of the semi-transmitting portion 620 may be adjusted according to a thickness of the first insulating layer 111 of the second area A2. In an embodiment, for example, as the thickness of the first insulating layer 111 for the second area A2 is reduced, the amount of light transmitted through the semi-transmitting portion 620 may be reduced.

As described above, when the first organic material layer 112 is developed after exposing the first organic material layer 112 by using the first halftone mask 600, the first area A1 and the second area A2 of the first insulating layer 111 may have different thicknesses from each other based on an amount of light exposure via the first halftone mask 600. The patterning of the first organic material layer 112 using the first halftone mask 600 may provide the first area A1 and the second area A2 of the first insulating layer 111 simultaneously.

Referring to FIG. 8, after providing or forming the first insulating layer 111, the pixel electrode 210 is provided or formed on the first insulating layer 111 in the first area A1. The pixel electrode 210 may be electrically connected to the drain electrode 138 through or at a contact hole provided or formed in the first insulating layer 111 at the first area A1.

Referring to FIG. 8, the second organic material layer 122 is provided or formed on the pixel electrode 210, and then the second organic material layer 122 is patterned by using a second halftone mask 700 to form the second insulating layer 120. In an embodiment, for example, the second halftone mask 700 may include a light transmitting portion 710 and a light blocking portion 720. Accordingly, the second insulating layer 120 has a barrier shape, and may be discontinuously or discretely provided or formed between two of the light-emitting area EA which are adjacent to each other.

When the second insulating layer 120 has a shape as described with reference to FIG. 5, the second halftone mask 700 may further include a semi-transmitting portion between the light transmitting portion 710 and the light blocking portion 720. The semi-transmitting portion may be configured to have a blocking rate that gradually increases in a direction along the substrate 100, from the light transmitting portion 710 toward the light blocking portion 720, instead of an overall uniform light transmittivity.

In addition, when the second insulating layer 120 is provided or formed to include the extension portion 121 (FIG. 6) as described with reference to FIG. 6, the second halftone mask 700 may include a semi-transmitting portion corresponding to an area furthest from the light-emitting area EA at which the extension portion 121 is provided, instead of the light blocking portion 720 (leftmost and rightmost in FIG. 8) which is furthest from the light-emitting area EA.

In the above description, while a negative type photolithography process characterized in that exposed portions of the first organic material layer 112 and the second organic material layer 122 remain during development has been described as an example, the present disclosure is not limited thereto. In an alternative embodiment, a positive type photolithography process in which a light receiving portion is removed during development may also be used.

Referring to FIG. 9, the second insulating layer 120 is provided or formed to have an opening therein exposing a center portion of the pixel electrode 210. An intermediate layer 220 is provided or formed in the opening of the second insulating layer 120, and the common electrode 230 may be provided or formed on the intermediate layer 220, thereby providing or forming the light-emitting element 200. In addition, the first inorganic encapsulation layer 510, the organic encapsulation layer 520, and the second inorganic encapsulation layer 530 may be sequentially provided or formed on the common electrode 230, to manufacture the display device 10.

According to one or more embodiment of the present disclosure, the total volume of an organic material in a display device may be minimized. Accordingly, outgassing of an organic material may be minimized, and even when the display device is exposed to sunlight for a relatively long period of time, decomposition of the organic material due to sunlight may be minimized or effectively prevented, thus increasing the reliability of the display device. However, the scope of the present disclosure is not limited by the above-described effects.

It should be understood that embodiments described herein should be considered in a descriptive sense only and not for purposes of limitation. Descriptions of features within each embodiment should typically be considered as available for other similar features in other embodiments.

While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display device, the method comprising:

providing a thin film transistor on a light-emitting area of a substrate;

providing a first organic material layer covering the thin film transistor, and patterning the first organic material layer to provide a first insulating layer;

providing a pixel electrode electrically connected to the thin film transistor; and providing a second organic material layer covering the first insulating layer and the pixel electrode, and patterning the second organic material layer to provide a second insulating layer which defines the light-emitting area, wherein the first insulating layer comprises:
- a first area corresponding to the light-emitting area, and
- a second area disposed outside the light-emitting area, the second area having a thickness which is less than a thickness of the first area, within the light-emitting area, the second insulating layer covers edges of the pixel electrode and covers external lateral surfaces of the first area of the first insulating layer, and a height of the second insulating layer decreases along a direction from the first area to the second area.

2. The method of claim 1, wherein the providing the second insulating layer exposes the pixel electrode to outside the second insulating layer, and the method further comprises:
providing an intermediate layer including an organic emission layer on the pixel electrode which is exposed to outside the second insulating layer, and
providing a common electrode on the intermediate layer.

3. The method of claim 2, wherein the providing the second insulating layer further exposes an upper surface of the second area of the first insulating layer to outside the second insulating layer, and the providing the common electrode directly contacts the common electrode with the upper surface of the second area of the first insulating layer which is exposed to outside the second insulating layer.

4. The method of claim 3, wherein the providing the second insulating layer disposes an end portion of the second insulating layer in the second area of the first insulating layer and having a concave curved surface.

5. The method of claim 1, wherein the providing the second insulating layer disposes an extension portion of the second insulating layer covering the second area of the first insulating layer, and an upper surface of the extension portion which is furthest from the substrate, is closer to the substrate than an upper surface of the first area of the first insulating layer which is furthest from the substrate.

6. The method of claim 1, wherein an upper surface of the first area of the first insulating layer is planar, and the providing the pixel electrode disposes the pixel electrode on the upper surface of the first area of the first insulating layer which is planar.

7. The method of claim 1, wherein the patterning the first organic material layer comprises using a first halftone mask, and provides the first area and the second area of the first insulating layer simultaneously.

8. The method of claim 1, wherein the patterning of the second organic material layer comprises:
using a second halftone mask, and
removing a portion of the second organic material layer corresponding to the second area of the first insulating layer.

9. The method of claim 2, further comprising providing a first inorganic encapsulation layer, an organic encapsulation layer and a second inorganic encapsulation layer on the common electrode.

* * * * *